United States Patent [19]

Hawkswell

[11] Patent Number: 4,934,891
[45] Date of Patent: Jun. 19, 1990

[54] COMPONENT SUPPLY STRUCTURE

[75] Inventor: Victor T. Hawkswell, Witham, England

[73] Assignee: Emhart Industries, Inc., Hartford, Conn.

[21] Appl. No.: 149,799

[22] Filed: Jan. 29, 1988

[30] Foreign Application Priority Data

Feb. 5, 1987 [GB] United Kingdom ............... 8702619

[51] Int. Cl.⁵ .............................................. B65H 5/08
[52] U.S. Cl. ..................................... 414/223; 29/809; 108/90; 108/103; 235/383; 235/385; 312/97.1; 414/225; 414/401; 414/584
[58] Field of Search ............... 414/223, 225, 401, 584; 221/13, 120, 122; 108/103, 104, 90; 312/250, 249, 266, 97.1; 29/809, 840, 836, 740; 198/341, 583, 803.01; 235/375, 383, 385, 462; 318/568.1, 568.16; 364/513

[56] References Cited

U.S. PATENT DOCUMENTS

| | | | |
|---|---|---|---|
| 4,217,978 | 8/1980 | Stalker | 198/345 |
| 4,226,567 | 10/1980 | Van Orsdale, Jr. | 414/744 A X |
| 4,519,522 | 5/1985 | McElwee | 221/13 |
| 4,622,457 | 11/1986 | Bradley et al. | 235/462 X |
| 4,675,993 | 6/1987 | Harada | 414/752 X |
| 4,756,077 | 7/1988 | Bianchi | 29/840 X |
| 4,814,592 | 3/1989 | Bradt et al. | 235/383 X |

FOREIGN PATENT DOCUMENTS 76249  4/1986  Japan ................... 414/223

Primary Examiner—Robert J. Spar
Assistant Examiner—Donald W. Underwood
Attorney, Agent, or Firm—Spencer T. Smith

[57] ABSTRACT

It is necesary to supply electronic components to a precise location in a transfer station 26, the components being supplied in a plurality of magazines 22 e.g. for a component placement machine. Desirably the magazines may be readily exchanged without significant time being taken in setting up the magazine position accurately. Suitably the magazines are mounted on a turntable 24 each magazine having a location mark 362 positioned accurately relative to a transfer position 286. Drive structure 264 moves the turntable 24 to present the transfer position 286 of the magazine 22 at the transfer station 26 and sensing structure 358 senses the mark 362 when the supply structure 18 is in a characterizing mode. Information supplied by the sensing structure 358 determines when the transfer position 286 is at a precise location of the transfer station 26. When the supply structure 18 is in an operational mode, the transfer position 286 of the magazine is presented at the precise location of the transfer station 26, directly.

3 Claims, 8 Drawing Sheets

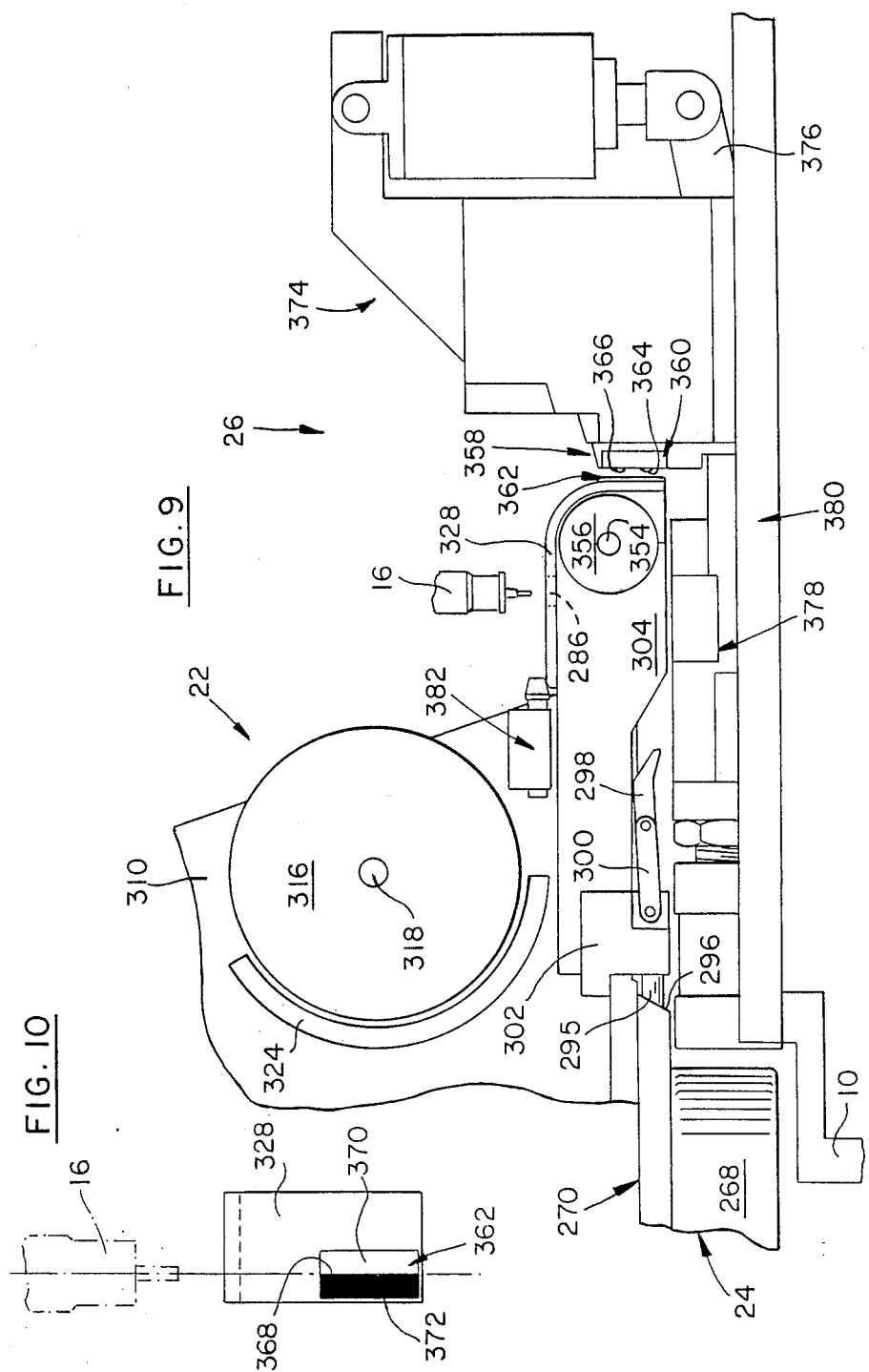

COMPONENT SUPPLY STRUCTURE

BACKGROUND OF THE INVENTION

This invention is concerned with component supply means especially suitable for electrical or electronic components of a variety of shapes and sizes, for example so-called flat packs, S.O. style transistors, leadless chip carriers, dual in line packages, melf-type components and the like, as well as so-called "chips".

In the manufacture of electrical or electronic equipment it is necessary to assemble a plurality of components on a suitable substrate, for example a printed circuit board. A number of systems have been proposed for handling the components to be placed on a substrate and many of these have proposed the use of pick-up heads having a suitable tool by which a component may be picked up. The tools have been of various types, depending on the components to be handled to some extent; for example the tools may mechanically grip the components or may use suction or a magnetic system to retain a component on the tool of the pick-up head when the component is removed from a suitable component supply means for delivery elsewhere for example to a suitable placement position where the component may be placed on a substrate e.g. a printed circuit board.

In the mounting of components on substrates especially placement of electrical or electronic components on printed circuit boards, in particular using surface mounting techniques, it is important to present a variety of components for use rapidly. Components are conveniently supplied in appropriately constructed magazines, many of which are already known. One known type of magazine which is especially convenient for the supply of components to a component placement machine for use in surface mounting is known as a tape feeder: in this type of magazine, components are housed in pockets equally spaced along a tape which is wound around a suitable reel: whenever it is desired to use a component from such a magazine the tape is indexed through a feed step (equivalent to the spacing between one of the pockets and the next adjacent pocket) to present a component at a transfer position of the magazine where the component may be transferred to other operating instrumentalities, for example a pick-up head of a component placement machine.

In order to minimise breaks in production it is important that when a supply of components in a magazine is exhausted, the supply can readily be replenished. For many magazines this is most readily accomplished by removing a magazine and replacing it by a new magazine; even using tape feeders, where the reels can be replaced, the time necessary to remove an old reel, replace it by a new reel and thread the tape correctly through the feeding instrumentalities of the magazine is time consuming and often more easily accomplished when the magazine is not in place on a component supply means. Thus even tape feeders may be more appropriately exchanged than reloaded in situ on component supply means. Furthermore, should it be desired to change components to be supplied for a particular purpose, for example when it is wished to place components on a printed circuit board of different design using some different components, it may be necessary to exchange a number of magazines to provide appropriate components, although preferably the component supply means mounts a sufficient number of magazines to provide components for a number of different substrates for example a variety of relatively simple printed circuit boards as well as one or more complex substrates. Indeed, where a sufficiently substantial change in the purpose for which components are to be supplied is necessary, it may in some cases be preferable to exchange a whole component supply means, removing the original supply means and replacing it by a similar supply means having magazines supplying a whole range of different components.

In some applications, for example supply of components to a placement machine for surface mounting, for most efficient operation it is important that the components be presented for transfer at a precise location of a transfer station for transfer to further operating instrumentalities, for example the pick-up head of a component placement machine. While it is theoretically possible to manufacture a component supply means including exchangeable magazines to such precise tolerances that the necessary precision is achieved in the manufacture of the component supply means, the cost of such accurate engineering on the scale necessary would be enormous: for example, a component supply means of a component placement machine for surface mounting may comprise 150 magazines and not only would the carrier on which the magazines are to be mounted need to be constructed very accurately but each of the magazines would need to be constructed with the same degree of accuracy.

One of the various objects of the present invention is to provide an improved component supply means, especially an improved component supply means for supplying electrical or electronic components.

Another object of the invention is to provide an improved component placement machine.

BRIEF SUMMARY OF THE INVENTION

The invention provides, in one of its aspects, component supply means comprising a carrier, a plurality of component supply magazines mounted on the carrier each magazine having a component transfer position at which components in the magazine are presented for transfer and having a location mark precisely positioned in a predetermined position relative to the transfer position, drive means for moving the carrier to present the component transfer position of a magazine at a transfer station, sensing means mounted at the transfer station to sense the location mark on a magazine at the station when the supply means is in a characterising mode and control means to which information is supplied from the sensing means when the supply means is in its characterising mode for determining when the transfer position of a magazine is at a precise location of the transfer station and, when the supply means is in an operational mode, for controlling the drive means to present the transfer position of the magazine at said precise location of the transfer station from which components are to be transferred.

Preferably the sensing means of supply means in accordance with the invention comprises means for emitting radiation towards the location mark of a magazine at the transfer station e.g. a light emitting diode and means for detecting reflected radiation, for example a photo diode. In this event, the location mark on each magazine is suitably provided by the junction between the region which reflects the radiation emitted by the light emitting diode and a region which does not reflect that radiation, the control means being arranged to identify this junction.

Preferably in component supply means as set out in the last two preceding paragraphs the magazines are exchangeably mounted and, to this end, the supply means comprises cooperating location means on the carrier and the magazines by engagement of which magazines may be mounted on the carrier in mounting positions spaced substantially equally one from the next.

The invention also provides, in another of its various aspects, component supply means comprising a carrier and a plurality of magazines exchangeably mounted on the carrier, the carrier being mounted for movement to present a selected one of the magazines at a transfer station, the supply means further comprising cooperating location means disposed on the carrier and the magazines by engagement of which magazines may be located on the carrier in mounting positions spaced substantially equally one from the next considered in the direction of movement of the carrier and clamp means comprising cooperating locating faces on the magazine and carrier and clamping instrumentalities on each magazine so constructed and arranged that by engagement of the instrumentalities with the carrier the magazine may be clamped to the carrier with the locating faces in engagement whereby to locate the magazine transversely to the direction of movement of the carrier.

In preferred component supply means in accordance with the invention the location means comprises location holes in the carrier and cooperating location pegs on the magazines. The carrier of preferred supply means in accordance with the invention comprises a supporting surface (in which, where the location means comprises location holes, the location holes are provided) on which the magazines are supported, the locating face on the carrier meeting the supporting surface to form a substantially V-shaped locating portion received in a complementary V-shaped groove provided on the magazine, the locating face on the magazine being provided by one of the faces defining the V-shaped groove. The preferred clamping instrumentalities comprise a toggle mechanism including a clamping bar which, when the toggle mechanism is locked, is urged against an inclined face of the carrier whereby both to impel the locating faces firmly into engagement with one another and to clamp the magazine firmly against the supporting surface of the carrier.

The carrier of preferred component supply means according to the invention comprises a turntable, preferably mounted on a carriage. In this preferred component supply means the magazines are mounted on the turntable with their transfer positions lying in an annular region centred on an axis of rotation of the turntable, substantially equally placed about the axis. This preferred component supply means may be operated in a characterising mode or an operational mode. When the supply means is in the characterising mode control means of the preferred supply means is arranged to index the turntable through a series of equiangular rotary steps corresponding with the spacing between the transfer positions of adjacent magazines starting from an initial position in which the transfer position of a first magazine is at the transfer station thereby establishing a reference position of the turntable, to record said reference position, to sense the location mark of the first magazine and, by comparison with said reference position, to determine and record the rotary position about its axis of rotation of the turntable in which the transfer position of the first magazine is at said precise location, to index the turntable through one of said rotary steps to present the transfer position of a second magazine at the transfer station and by sensing its location mark to similarly determine and record the rotary position about its axis of rotation of the turntable in which the transfer position of the second magazine is in said precise location, and to repeat the indexing movement until the rotary position of the turntable about its axis of rotation has been determined and recorded for every magazine mounted on the turntable whereby when the supply means is in its operational mode the control means rotates the turntable to the recorded rotary position necessary to present the transfer position of a selected magazine at said precise location of the transfer station. In such a component supply means the control means records a digital representation (suitably representative of a number of pulses) of the rotary positions of the turntable necessary to present the transfer positions of the magazines at said precise location of the transfer station. Preferably the drive means of this preferred supply means comprises a servo motor including a rotary encoder, the rotary encoder producing pulses corresponding to the digital representation in known manner: servo motors with rotary encoders are already known for use in moving mechanism to a desired position in this manner. Alternatively, the drive means may comprise stepping motors also utilising pulses to drive the stepping motor to a desired extent in known manner; however, stepping motors are expensive and not as flexible as the servo motor and rotary encoder system which is preferred.

Component supply means in accordance with the invention is suitably provided as the component supply means of a component placement machine for electrical or electronic components, especially for such a placement machine for use in surface mounting.

The invention further provides, in yet another aspect, a component placement machine for electrical or electronic components comprising a frame, placement means mounted on the frame adapted to receive components at a transfer station and place them at desired positions on a substrate and component supply means arranged to supply components to the transfer station, the component supply means comprising an exchangeable carriage by which a plurality of component magazines are carried for presentation of components at the transfer station, positioning means by which the carriage may be positioned in a desired position relative to the frame and locking means by which the carriage may be locked in that position to the frame.

The positioning means of a machine as set out in the last preceding paragraph preferably comprises locating jaw means on the frame and projections on the carriage arranged to engage the locating jaw means to position the carriage in said desired position relative to the frame. In this event, the locking means suitably comprises threaded bolts by which the projections may be urged into engagement with locating surfaces of the jaw means to position the carriage in said desired position and to lock the carriage to the frame.

There now follows a detailed description, to be read with reference to the accompanying drawings, of a component placement machine comprising component supply means embodying the invention. It will be realised that this component placement machine has been selected for description to illustrate the invention by way of example and not of limitation of the invention.

BRIEF DESCRIPTION OF THE DRAWINGS

In the accompanying drawings:

FIG. 9 is a fragmentary view of part of the illustrative machine showing sensing means of the illustrative machine; and FIG. 10 is a fragmentary view showing a location mark of a magazine of the illustrative machine.

DETAILED DESCRIPTION OF PREFERRED EMBODIMENT OF THE INVENTION

Figure 1:
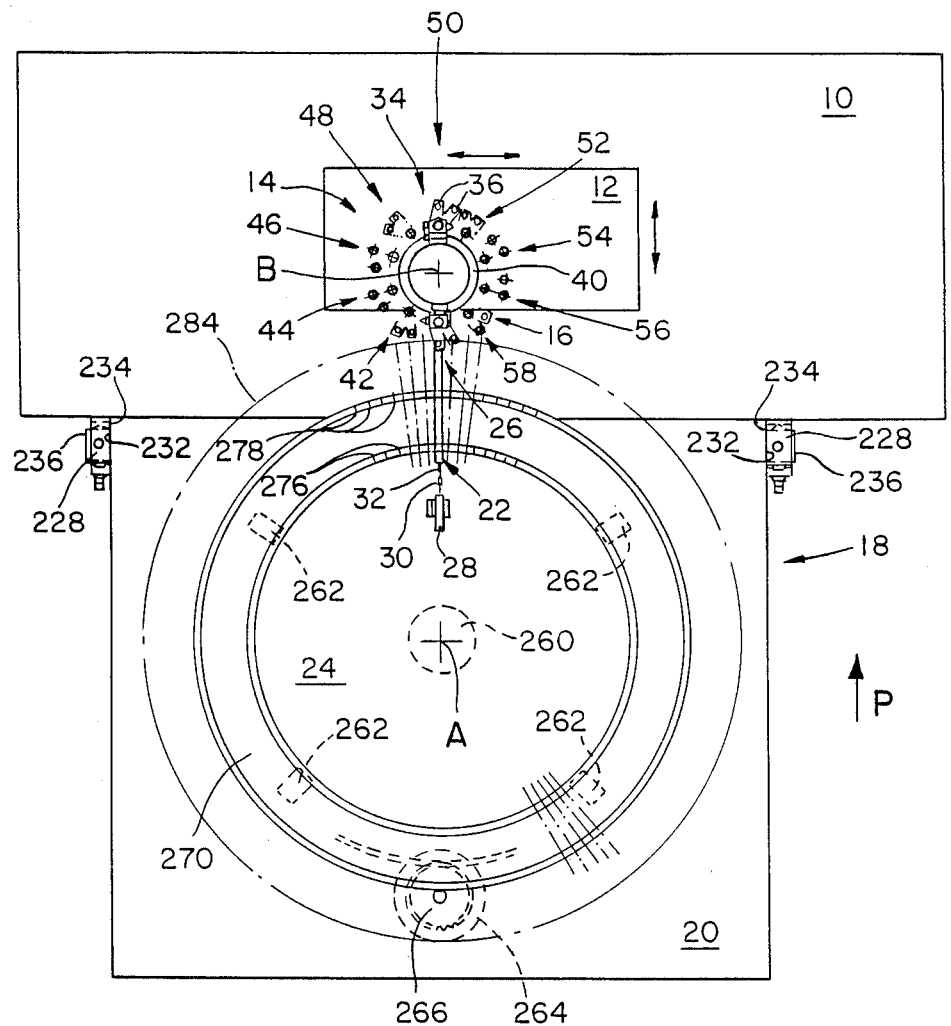
FIG. 1 is a diagrammatic plan view of the illustrative component placement machine.

A component placement machine embodying the invention is shown in FIG. 1. The machine comprises a frame 10 on which is mounted an X-Y table 12 and apparatus for handling electrical components comprising placement means including a plurality of pick-up heads 16 and a support comprising a carousel 14 on which the pick-up heads 16 are mounted. Substrates (not shown) on which components are to be placed may be mounted in known manner in accurately known positions on the X-Y table; means (not shown) may be provided for feeding substrates to and from the X-Y table 12 for example as described in United Kingdom Patent No. 2150098. The X-Y table may be mounted and driven by any suitable means, a number of which are known: preferably the X-Y table 12 is mounted and driven by means substantially similar to those described in PCT patent application publication No. WO 85/03404.

The component placement machine further comprises component supply means 18 comprising a carriage 19 including a sub frame 20, secured in known location to the main frame 10, on which are mounted a plurality of component supply magazines 22. The component supply means 18 comprises a turntable 24 mounted for rotation about a vertical axis A on the sub frame 20, the component supply magazines 22 being mounted radially (about the axis A) on the turntable. In the operation of the illustrative component placement machine, the turntable is rotated about the axis A by drive means to move an appropriate one of the component supply magazines 22 to a transfer station of the supply means 18 viz. a pick-up station 26. The component supply magazines 22 shown in FIG. 1 are so-called tape feeders but other forms of magazine may be used if desired, for example so-called "stick" feeders, vibratory feeders, or stack feeders of the type described in detail in our United Kingdom Patent No. 2147888. As is well known, the components in a tape feeder are packaged in pockets disposed at equally spaced intervals along a flexible tape which is wound about a suitably dimensioned reel; the components are preferably positioned in the pockets of the tape in an orientation which is known—however, neither the positioning nor the orientation of the components in the pockets needs to be particularly precise. In order to deliver a component using a tape feeder to a pick-up position, the tape is indexed to move the tape through a feed step identical with the spacing between the centre of one pocket and the centre of the next adjacent pocket. The component supply means 18 of the illustrative component placement machine comprises a cylinder 28 mounted on the sub-frame 20 in register with a component supply magazine 22 at the pick-up station 26. The cylinder 28 is so positioned that, on admission of fluid under pressure to the cylinder 28 behind a piston slideable in the cylinder, in the operation of the machine, a piston rod 30 is extended from the cylinder into engagement with an indexing plunger 32 of the magazine, whereby to index the tape, carrying components, through a feed step to present a component at the pick-up position of the pick-up station 26.

As mentioned above, the carousel 14 carries a plurality of pick-up heads 16. The pick-up heads 16 are mounted on carriers 34, each carrier 34 comprising a bifurcated member 35 having two arms 36, at an outer end portion of each of which a pick-up head is clamped. Each carrier 34 is mounted on a vertical rod 38 for sliding movement lengthwise of the rod; the bifurcated member 35 is also mounted for rotary movement about a vertical axis C of the rod 38. Each rod 38 is secured to a spider member 40 of the carousel 14 at an end portion of one of ten arms of the spider member 40. Thus the carousel 14 of the illustrative machine comprises ten carriers 34 and twenty pick-up heads 16.

Each carrier 34 also comprises a bracket 60 on which is mounted a slideway 62 having opposite outer edge surfaces parallel to one another and extending generally vertically parallel to the axis C of the associated rod 38. Guide rollers 64 are arranged to run on the opposed parallel guide surfaces of the slideway 62, the guide rollers 64 being rotatably mounted on clamp means 66 secured to the spider member 40. The clamp means 66 also clamps the rod 38 to the spider member 40. By appropriate adjustment of the various parts of the clamp means 66 the position of each carrier 34 relative to adjacent carriers 34 can be adjusted during the initial setting up of the illustrative machine to accurately locate operative positions of the carriers 34 as discussed below.

As hereinbefore mentioned each carrier 34 comprises a bifurcated member 35 comprising two arms 36. Each of the bifurcated members 35 is carried for vertical movement along the rod 38 by its associated bracket 60 and is mounted for pivotal movement about the axis C of the associated one of the rods 38 to move the pick-up heads 16 at the ends of the arms 36 between an operative position and inoperative positions. A pneumatically operated piston and cylinder arrangement (not shown) is mounted on each of the brackets 60 with the cylinder axis extending generally vertically, to operate a flexible linkage, viz. a bowden cable mechanism 68 to pivot the bifurcated member 35 about the axis C and move one or other of the two pick-up heads 16 associated with that particular carrier 34 into the operative position associated with that carrier, the other of the pick-up heads, of course, being simultaneously moved to its inoperative position. Whereas the preferred flexible linkage is a bowden cable mechanism other types of flexible linkage may be used if appropriate e.g. suitable chain or belt linkages. However the bowden cable mechanism is preferred because of its simplicity, compactness and ability to be readily flexed to a suitable position. The operative positions associated with each of the carriers 34 are equiangularly spaced about a vertical axis B about which the carousel 14 is rotatable, the operative positions of the pick-up heads 16 being determined by the position of pick-up surfaces of the heads when placing a component on a substrate at a placement station 50 which should each occupy precisely the same location.

The carousel 14 is mounted for rotation on a column (not shown) fixed to the main frame 10. An appropriately configured cam track is formed around the column. A cam provided by a cam roller (not shown) is mounted on the bracket 60 of each of the carriers 34, the cam rollers being received in the cam track of the column. The cam rollers are urged against a lowermost surface of the cam track and are adjusted so that horizontal datum surfaces of each carrier 34 lie in the same horizontal place when that carrier is at the placement station 50. Thus, as the carousel 14 rotates about its axis B on the column the cam rollers slide in the cam track and cause movement of the brackets 60 (and thus the heads 16 mounted on those brackets 60) in a direction parallel with the axis B during part, at least, of a complete revolution of the carousel 14.

Means (not shown) comprising motor means and a computer control system of the illustrative machine are provided for intermittently rotating the spider member 40 about the vertical axis B of the carousel 14 upon a signal from the computer control system. Preferably the motor means comprises a servo motor and rotary encoder controlled by the control system to rotate the spider member 40 through a suitable gear system (not shown). Each intermittent rotary motion of the spider member 40 advances an arm of the spider member through an angle of 36°. Thus the carousel 14 is mounted for indexing movement around the axis B to index the pick-up heads 16 at operative positions disposed at equally spaced intervals about the axis of rotation B of the carousel 14 in a stepwise movement through a plurality of stations of the illustrative machine. The stations comprise the pick-up station 26, a coarse orientation station 42, a mechanical orientation station 44, an inspection station 46, a fine orientation station 48, the placement station 50, a spare station 52, a dump station 54, a head select station 56 and a pre-orientation station 58; further details of the various stations will be given in the following description.

Each of the pick-up heads 16 is substantially identical in construction and operation, the only significant difference being the dimensions and configuration of pick-up surfaces of tools of each pick-up head 16. For convenience, therefore, only one pick-up head 16 will be described in detail hereinafter: this pick-up head is shown in detail in FIG. 2 of the accompanying drawings.

Figure 2:
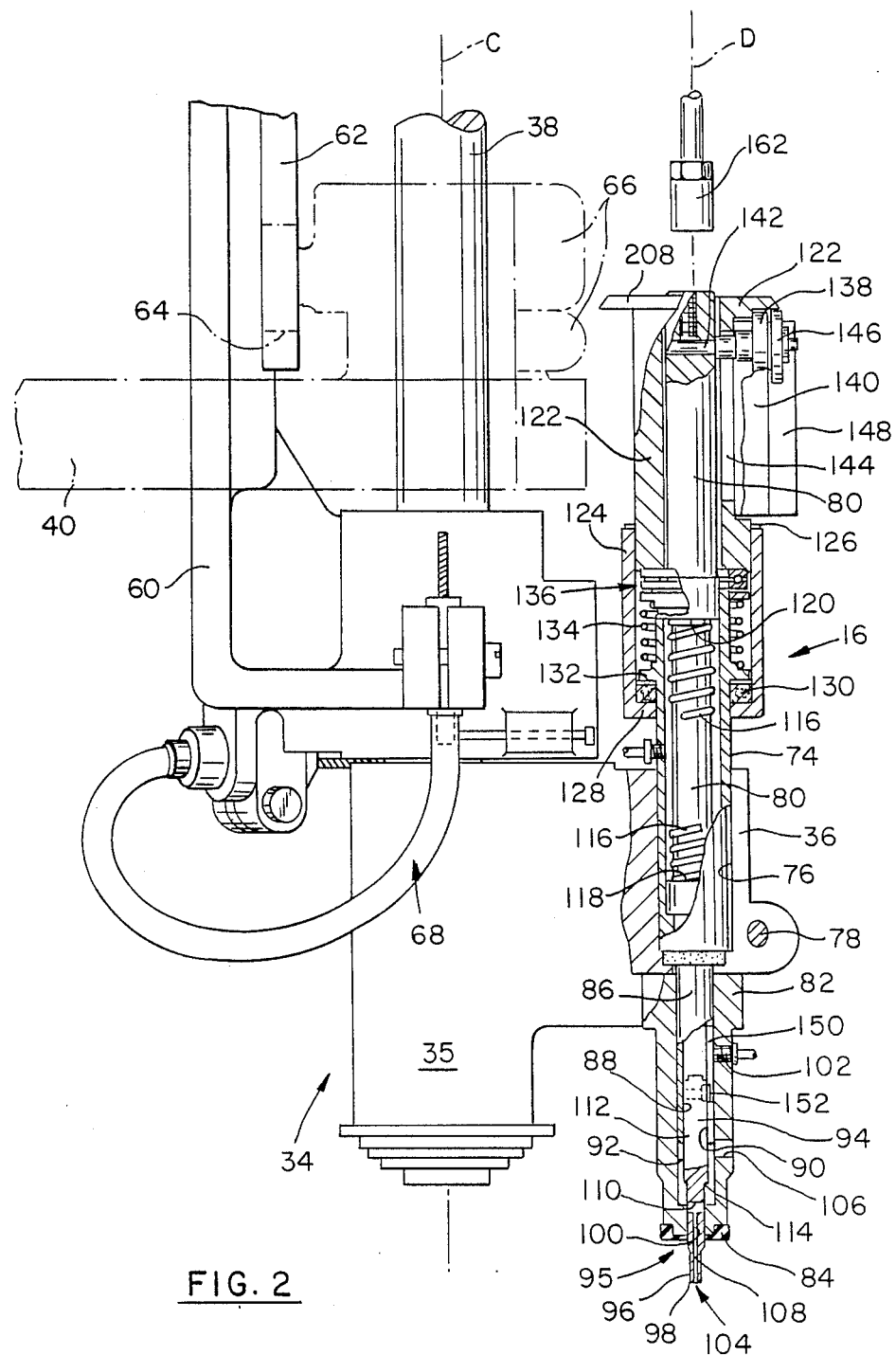
FIG. 2 is a side view, partly in section and with parts broken away showing suction pick-up apparatus of the machine.

As hereinbefore mentioned each pick-up head 16 is mounted at an end portion of one of the arms 36. A tubular support housing 74 of the head 16 is received in a cylindrical bore 76 in the arm 36 and clamped in place by a bolt 78 with an axis D of the pick-up head 16 substantially vertical. The head also comprises a tool having an elongated support member 80 mounted in bearings carried by the housing 74 for movement in a direction lengthwise of the axis D and for rotational movement about the axis D. A tool body 82 is secured to a lower end portion of the support member 80 below the arm 36; the tool body 82 terminates at a lower end portion in a first pick-up surface 84 of an appropriate dimension and configuration. A lower end portion 86 of the support member 80 is housed in a cylindrical bore 88 of the tool body 82, the lower end portion 86 forming a substantially airtight seal with the cylindrical bore 88 and the tool body 82 being secured to the lower end portion 86 by suitable clamping means (not shown). A cylinder 90 is formed in the lower end portion 86 of the support member 80 within the body 82, the cylinder being coaxial with the axis D and opening downwardly into a chamber 92 formed by a lower portion of the cylindrical bore 88. A piston member 94 is mounted for sliding movement in the cylinder 92 and at a lower end portion provides a pick-up end portion 95 terminating with a tip 96 having a second pick-up surface 98 of the tool at the lowermost end portion thereof. The second pick-up surface 98 is of smaller cross-sectional area than the first pick-up surface 84. The pick-up end portion 95 of the piston member 94 is slideable in a passage 100 in the tool body 82 between an operative position in which the tip 96 projects through an opening (provided by the end Of the passage 100) in the first pick-up surface 84 beyond the first pick-up surface 84 (in which position the piston member is shown in FIG. 2) and an inoperative position in which the tip 96 is retracted into the tool body 82 inwardly of the first pick-up surface 84. A first port 102 is provided in the tool body 82; air can be admitted through the first port 102 to the cylinder 90 above the piston member 94 to drive the piston member 94 downwardly to its operative position. The first port 102 can likewise be connected to vacuum to retract the piston member 94 to its inoperative position.

The illustrative component placement machine further comprises valve means (not shown) for controlling flow of air and connection of vacuum to the various ports of the illustrative machine, through appropriate pipes; in the case of ports e.g. the port 102, in the tool use of flexible piping may be necessary to accommodate movement of the tool. The illustrative machine also comprises means so constructed and arranged that when the piston member 94 is in its inoperative position suction may be applied to the first pick-up surface 84 whereby a component (not shown) engaged by the first pick-up surface 84 is retained in contact with the surface 84 when suction is applied and that when the piston member 94 is in its operative position suction may be applied through an opening 104 in the piston member 94 to the second pick-up surface 98 whereby a component engaged by the second pick-up surface 98 is retained in contact with the second pick-up surface 98 when suction is applied through the opening 104. To effect application of suction through the opening 104 the tool body 82 comprises a second port 106 opening to a passage (provided by the chamber 92 in the tool body 82) which is closer to the first pick-up surface 84 than is the cylinder 90. The opening 104 is the termination of a lengthwise passage 108 in the pick-up end portion 95 of the piston member 94 extending from the second pick-up surface 98 in the direction in which the piston member 94 is slideable; a transverse passage 110 in the piston member 94 communicates with the chamber 92 and the lengthwise passage 108, the chamber 92 thereby being in communication with the opening 104 whereby to apply suction through the opening 104.

The pick-up end portion 95 of the piston member 94 is slidingly received in the connecting passage 100 in the tool body 82 which terminates in the opening in the pick-up surface 84 through which the tip 96 projects when the piston member 94 is in its operative position, the tool body 82 bounding the passage 100 providing a substantially airtight seal about the pick-up end portion 95 of the piston member 94. The tip 96 of the piston member 94 is of smaller cross-sectional area than the remainder of the pick-up end portion 95 which slides in the passage 100 terminating in the opening in the first pick-up surface 84 whereby when the piston member 94 is in its inoperative position the chamber 92 in the body 82 is in communication around the tip of the piston member 94 through the passage 100 with the opening in the first pick-up surface 84 whereby to apply suction to the first pick-up surface 84. The pick-up head 16 is so dimensioned that the transverse passage 110 in the piston member 94 remains in communication with the chamber 92 when the piston member 94 is in its inoperative position whereby suction is applied to the first pick-up surface 84 through the opening 104 in the piston member 94 as well as around the tip 96 thereof.

A piston portion 112 of the piston member 94 which is slideable in the cylinder 90 is of greater diameter than the pick-up end portion 95 of the piston member 94, providing a shoulder 114, facing downwardly, at the junction of the piston portion 112 and the pick-up end portion 95 whereby when the piston member 94 is in its operative position application of vacuum to the first port creates a vacuum in the cylinder 90 and application of the same vacuum to the second port draws air under atmospheric pressure through the opening 104 and passage 108 in the piston member 94 into the chamber 92, the air under atmospheric pressure thereby urging the piston member 94 towards its inoperative position. After the piston member 94 has reached its inoperative position continued application of vacuum to the second port 106 is effective to apply suction through the opening to the first pick-up surface 84.

As hereinbefore mentioned the support member 80 is mounted in a tubular support housing 74 for sliding movement lengthwise of the axis D of the pick-up head 16 relative to the housing 74. A spring 116 acting between a stop face 118 in the housing and a collar 120 on the support member 80 urges the support member 80 to a raised position determined by engagement of the tool body 82 with a stop face of the arm 36 in which the pick-up head 16 is mounted. When the carousel 14 is being rotated about its axis B the pick-up heads 16 occupy this raised position in which they are clear of other operating instrumentalities the illustrative machine.

As well as being movable lengthwise of the axis D of the pick-up head 16 the support member 80 and the tool body 82 are for rotation around the axis D as described below. An upper end portion of the elongated support member 80 projects upwardly beyond an uppermost part of the tubular support housing 74. The tool of the illustrative machine further comprises coupling means including a drive sleeve 122 slidingly received on this upper end portion of the support member 80 and a tubular member 124; a lower end portion of the drive sleeve 122 is received in a cylindrical upper end portion of the tubular member 124 to which the drive sleeve 122 is secured. An outwardly projecting collar 126 of the drive sleeve 122 engages an upper edge of the tubular member 124. The tubular member 124 comprises, at a lower end portion, an inwardly projecting flange 128. A clutch pad 130 is supported on an upwardly facing surface of the flange 128 and is urged towards a downwardly facing surface of a collar 132 of the support housing 74 by a spring 134. Clutch means of the illustrative machine thus comprises the flange 128, the clutch pad 130, the collar 132 and the spring 134. The clutch pad 130 comprises slightly raised, radial, portions on opposite sides thereof, the raised portions at opposite sides of the pad being disposed along orthogonal radii, thus to provide accommodation for any slight misalignment of the parts of the tool and to ensure adequate engagement of the pad and surfaces. The spring 134 acts between an upwardly facing surface of the collar 132 and a lower member of a bearing race 136 slidingly received on an outer upper end portion of the housing 74 and with an upper member of the race 136 housed in a recess in a lower face of the drive sleeve 122. Thus, in a normal condition of the pick-up head 16, the spring 134 bearing on the race 136 urges the drive sleeve 122 upwardly, relative to the housing 74, the drive sleeve 122 secured to the tubular member 124 thus urging the tubular member 124 upwardly and, through the flange 128, urging the clutch pad 130 firmly against the collar 132 of the support housing 74. Thus, in normal condition of the pick-up head, the tubular member 124 is locked through the clutch pad 130 to the collar 132 of the housing so that the tool cannot rotate relative to the housing and thus is unable to rotate about the axis D. However, by a downward pressure, viz. along the axis D, on the drive sleeve 122, the clutch pad 130 may be released from the collar 132 thereby permitting rotation of the tool about the axis D. In order to effect such rotation, therefore, where it is necessary in the operation of the illustrative machine, orienting means 192 is provided to engage the drive sleeve 122 and urge it downwardly to release the clutch pad 130 (permitting rotation of the drive sleeve 122 about the axis D) and to effect rotation of the drive sleeve 122 through a desired angle under the control of the computer control system. Rotation of the drive sleeve 122 is effective to rotate the support member 80 (and thus the tool body 82 secured thereto) about the axis D of the pick-up head 16 as described below.

As previously mentioned, the support member 80 is slideable lengthwise of the axis D relative to the drive sleeve 122. However, the support member 80 is engaged with the drive sleeve 122 for rotation about the axis D with the drive sleeve 122 as a unit: this engagement is effected by means of a roller 138 and guide member 140. The roller 138 is mounted for rotation on an axle 142 secured in an upper end portion of the support member 80, the axle 142 projecting through a slot 144 in the wall of the drive sleeve 122. The roller 138 is arranged to run on a vertical face of the guide member 140, the guide member 140 being secured to the drive sleeve 122; the vertical face of the guide member 140 is parallel with the axis D of the pick-up head 16. A second roller 146 is also mounted on the axle 142, outwardly of the roller 138, and engages a leaf spring 148 secured to the drive sleeve 122 and bearing on the roller 146 to urge the roller 138 firmly against the vertical face of the guide member 140. By adjustment of the position of the drive member 140 on the sleeve 122 during the initial setting up of the pick-up head 16 the angular orientation about the axis D of the support member 80 (and thus the tool body 82 thereto) relative to the drive sleeve 122 can be adjusted as desired. Thus, when the support member 80 is moved lengthwise of the axis D relative to the drive sleeve 122 engagement of the roller 138 with the vertical face of the guide member 140 assists in guiding the support member 80 along a path parallel with the axis D. During movement of the support member 80 and attached tool body 82 from the raised position in which the tool of the pick-up head is shown in FIG. 2 to a lower position and return movement to the raised position, rotation of the drive sleeve 122 is prevented by engagement of the clutch pad 130 between the flange 128 and collar 132 under pressure applied by the spring 134, thereby preventing rotation of the support member 80 about the axis D by means including the rollers 138, 146, guide member 140 and spring 148 discussed above.

A keyway 150 is formed in the wall of the cylinder 90 of the support member, the keyway extending parallel to the axis D of the pick-up head. A key 152 secured to the piston member 94 is engaged in the keyway, permitting sliding movement of the piston member 94 lengthwise of the axis D in the cylinder 90, relative to the tool body 82, but keying the piston member 94 to the support member 80 so that when the support member 80 is rotated about the axis D the piston member 94 is likewise rotated. Thus the orientation of both the tool body 82 and the piston member 94, about the axis D, relative to the drive sleeve 122, is fixed: rotation of the drive sleeve 122 through a known angle is therefore effective to likewise rotate both the tool body 82 and the piston member 94 through the same angle.

In for a component to be picked up from the component supply means 18 at the pick-up station 26 it is necessary to operate the tool of a pick-up head 16 which has been moved to the pick-up station 26 by rotation of the carousel 14 to move the selected one of the pick-up surfaces 84, 98 of the tool into engagement with the component, from the raised position of the tool, to retain the component against the selected one of the pick-up surfaces 84, 98 by suction applied as described above and to remove the component from the component supply means 18 by retraction of the pick-up tool to the raised position. Likewise, at the placement station 50 it is necessary to move the pick-up tool of a pick-up head 16 which has been moved by rotation of the carousel to the placement station, carrying a component retained on an appropriate one of the pick-up surfaces 84, 98 by suction as described above towards a substrate at the placement station 50 and to release the component placed on the substrate at the placement station 50 from the pick-up surface 84, 98. In order to effect these movements from the raised position in which the tool is shown in FIG. 2 to a lowered position and to return the tool to the raised position movement of the support member 80 and the tool body 82 attached thereto lengthwise of the axis D is necessary. To effect this movement, therefore, drive means 154 (see FIG. 3) is mounted on the main frame 10 (through the column referred to above) at the pick-up station 26 and placement station 50. The drive means 154 are generally similar in construction and operation and, for convenience, only one of the drive means 154 is described in detail hereinafter. The drive means 154 comprises a bracket 156 secured to the column and supporting aligned bearings 158 in which a tubular drive shaft 160 is mounted for vertical sliding movement. The tubular drive shaft 160 is positioned to be coaxial with the axis D of a pick-up head 16 disposed in an operative position at the station at which the drive means 154 is disposed.

A drive plunger 162 is mounted for vertical sliding movement in the tubular drive shaft 160 (see also FIG. 2). The drive plunger 162 comprises bearing members 164 slidingly received in a cylindrical interior of the drive shaft 160. Means (not shown) is provided for admitting air under pressure to a chamber 168 formed by the cylindrical interior of the drive shaft 160 above the upper bearing member 164. Admission of air under pressure to the chamber 168 tends to urge the drive plunger 162 downwardly relative to the drive shaft 160, to an extent permitted by engagement of the lower bearing member 164 with a stop 166 in the drive shaft: the plunger 162 will normally occupy this rest position.

Figure 3:
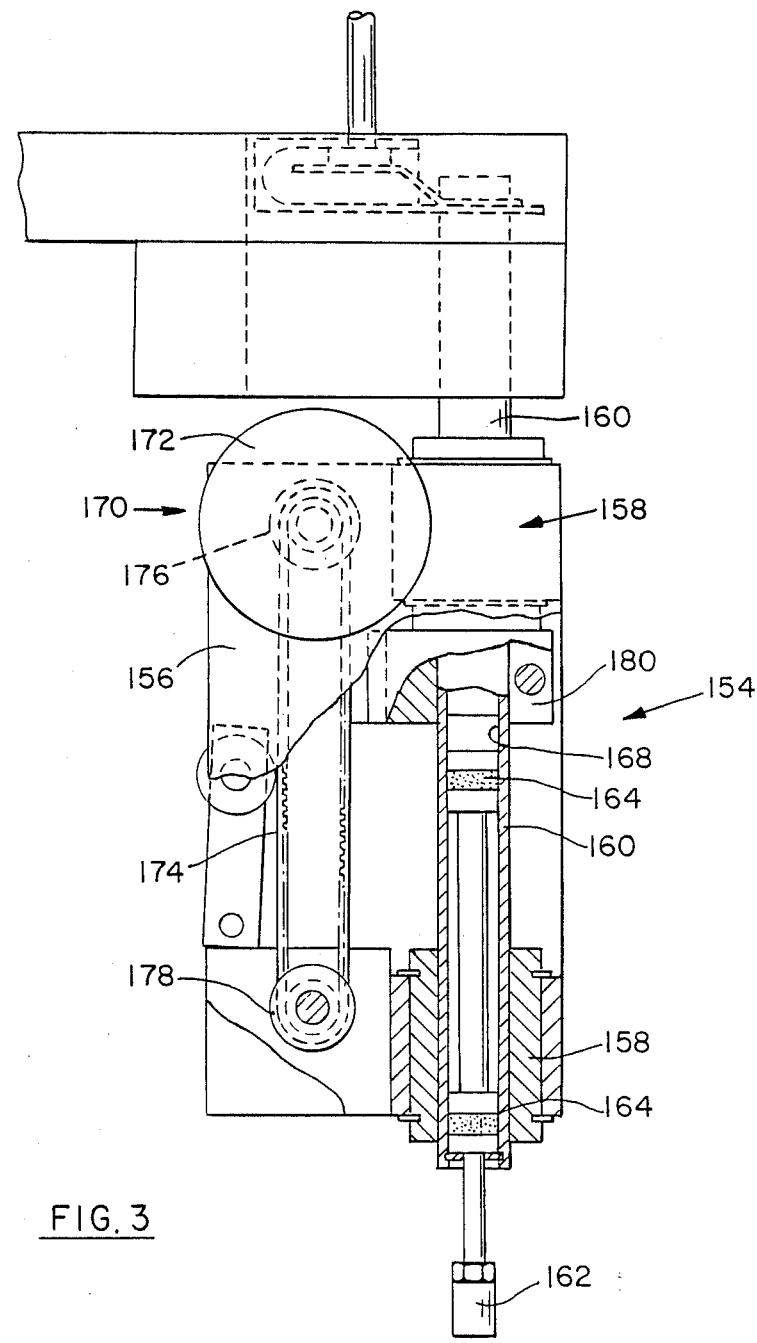
FIG. 3 is a side view, partly in section and with parts broken away showing drive means of the suction pick-up apparatus.

The drive means 154 further comprises motor means 170 arranged to drive the drive shaft 160 vertically to and from a raised position (in which the drive means is shown in FIG. 3) The motor means 170 of the illustrative machine comprises a servo motor 172, the angular rotation of which can be determined by a rotary encoder (not shown) in known manner. A continuous toothed belt 174 passes round a toothed pulley 176 on the output shaft of the servo motor 172 and a toothed idler pulley 178 mounted for rotation on the bracket 156 about an axis parallel with the output shaft of the servo motor 172 and disposed vertically beneath the output shaft of the servo motor 172, thereby providing two vertical runs of the toothed belt 174. A clamp 180 is clamped to the tubular drive shaft 160 and to one of the vertical runs of the toothed belt 174. Thus as the servo motor 172 rotates the vertical runs of the drive belt are caused to move in a vertical direction, the run of the toothed belt 174 to which the clamp 180 is attached causing corresponding movement of the drive shaft 160 vertically in the bearings 158. Using the encoder of the servo motor 172, the computer control system can control precisely the position to which the tubular drive shaft 160 is driven by the servo motor 172. Thus, when a pick-up head 16 is at a station of the illustrative machine with axis D aligned with the drive means, operation of the servo motor 172 can drive the shaft 160 downwardly so that the plunger 162 engages the upper end of the member 80 of the tool and drives it downwardly, as discussed in more detail below.

The illustrative machine comprises various interlocking safety mechanisms which prevent the drive means operating when the carousel 14 is rotating about its axis B and which prevent rotation of the carousel 14 if the drive shafts 160 are not in the rest position. In the illustrative machine no electrical connections are provided to the rotating carousel 14, the only service provided being pneumatic by the provision of compressed air or vacuum.

As described above, the illustrative machine provides drive means mounted at the pick-up station 26, the drive means being engageable with a portion of the tool of a pick-up head 16 at the pick-up station 26 to move the tool body 82 to carry one of the pick-up surfaces 84, 98 of the tool into engagement with a component presented at the pick-up station 26 by the supply means 18, the illustrative machine further comprising means provided by the spring 116 for raising he pick-up head 16 whereby to remove the component from the supply means 18. Similarly the illustrative machine comprises drive means mounted at the placement station 50 engageable with a portion of a tool of a pick-up head 16 at the placement station 50 to move the tool body 82 to place a component carried by the tool on a substrate at the placement station 50.

In order to achieve sufficient movement of the X-Y table 12 the uppermost surface of the table 12 and a substrate supported by the table is disposed below the lowermost level of the magazines 22 so that the X-Y table 12 and a substrate carried thereby may pass beneath the magazines during placement of components on the substrate. In order to restrict the amount of vertical travel of the pick-up heads 6 at any station, for example at the pick-up station 26 or the placement station 50, the cam track on the column is arranged to move the bracket 60 as the carousel 14 rotates about its axis B so that the bracket and thus the pick-up head 16 supported thereby occupy lower positions at the placement station 50 than at the pick-up station 26. The various operating means at intermediate stations are appropriately located to reduce the necessary thereby keeping the cycle time of the illustrative machine short.

At the mechanical orientation station 44 a mechanical location jaw system 182 may be disposed, a pick-up head 16 at the mechanical orientation station 44 being arranged to introduce a component carried by the pick-up head 16 to the mechanical location system 182. For some components, mechanical orientation by means of jaws may be unnecessary and the computer control system of the illustrative machine can be programmed to disable the mechanical location system 182 if this be desired. The mechanical location jaw system 182 of the illustrative machine comprises two pairs of jaws 184, 186. The first pair of jaws 184 are mounted for movement on a path R radial to the axis of rotation of the carousel and the second pair of jaws 186 are movable on a path T tangential to the path S of rotation of the pick-up heads carried by the carousel 14 in the operative positions. Means are provided for moving the jaws 184, 186 along these paths R, T to engage a component carried by a pick-up head 16 to the mechanical orientation station 44 and thereby orient the component relative to the axis D of the head 16. For certain components it is necessary to position the components relative to the axis D in only one of two orthogonal directions (radial to the axis B of the carousel 14): the radial jaws 184 are therefore disposed with an operative portion lying in the same plane as the path of travel of a component carried by a pick-up head 16, whilst the tangential jaws 186 are disposed below the path of travel of a component, the radial jaws being of sufficient height to extend into register with the disposition of the tangential jaws 186. A drive means 154 is disposed at the mechanical orientation station 44 which is operated only when it is necessary to orient a component using both sets of jaws 184, 186 to lower the component carried by the pick-up head 16 into register with both the radial jaws 184 and the tangential jaws 186. Where it is necessary only to use the radial jaws 184 the component is carried between the jaws by rotation of the carousel and no lowering of the pick-up head is necessary, thereby saving time. The means for moving the jaws along their radial and tangential paths comprises servo motors 188, 190 provided with rotary encoders, which are controlled by the computer control system of the illustrative machine and suitable connecting linkages. During rotation of the carousel 14 to carry a component to the mechanical orientation station 44 the control system signals the motors to adjust the spacing between the jaws 184, 186 suitable for delivery of the next component to be oriented, the adjustment being sufficient to allow introduction of the component between the jaws whilst reducing the travel necessary to perform an orientating operation as much as can safely be permitted. Use of servo motors 188,190 controlled in this way can also be desirable in limiting the closing motion of the jaws 184, 186 so that the jaws define a restricted area within which a component is located: the dimensions of this restricted area are conveniently selected to be slightly greater than the dimension of the component to be oriented, avoiding the possibility of the component being gripped between the jaws and damaged (which may occur very easily where a component is fragile, for example a chip).

In the operation of the illustrative machine using the suction pick-up apparatus the pressure exerted by the tool on a component when it is being picked up from the component supply 18 at the pick-up station 26 and when it is being placed on a substrate at the placement station 50 can be controlled. The motion of the tool of the pick-up head 16 along its axis D is affected, in the downward direction, by the drive shaft 160 driven by the servo motor 172 and the upward, return motion to the rest position of the tool is affected by the spring 116, under the control, however, of the servo motor 172, the spring 116 maintaining the upper end portion of the support member 80 in engagement with the drive plunger 162 as the tool rises until it reaches its rest position. The distance through which the support member 80 is driven downwardly by the servo motor 172 is dependent upon whether or not the first pick-up surface 84 or the second pick-up surface 98 is to be used and on the height of the component to be picked up as well as, at the placement station, the height of the surface of the substrate on which the component is to be placed. In all cases, the servo motor 172 is controlled by the computer control system of the illustrative machine to drive the support member 80 downwardly sufficiently far that a little-over travel occurs, cushioned by air under pressure, the pressure of the air being controlled to determine the force applied by the pick-up surface 84, 98 on the component as the component is pressed against the magazine 22 (at the pick-up station 26) or a substrate (at the placement station 50). Where the piston member 94 is in the operative position the cushion effect is provided by air under a suitable pressure admitted through the first port 102 to the cylinder 90 above the piston member 94. As the surface area of the second pick-up surface 98 on the piston member 94 is less than the surface area of the pick-up surface 84 the tool provided by the piston member 94 handles smaller components than the tool provided by the body 82 and pressure exerted on a component by the piston member 94 is therefore usually very small. When the piston member 94 is retracted and in its inoperative position the component will be engaged by the first pick-up surface: in this case the air cushion is provided by the air under pressure in the chamber 168 in the tubular drive shaft 160 of the drive means 154. The downward force exerted by air pressure in the chamber 168 is considerably greater than that exerted by air pressure in the cylinder 90 applied to the piston member 94 when the second pick-up surface 98 is in use.

When a component has been placed on a substrate at the placement station 50, air under pressure may be introduced through the second port 106, if desired, under the control of the control system to assist separation of the component from the pick-up surface 84, 98 by which it was engaged.

Although to operate the various parts of the illustrative machine servo motors and rotary encoders are used, other controllable drive means may be used e.g. stepping motor. However, servo motors are preferred in view of their speed of operation, precision and general convenience.

Orienting means 192 is mounted at each appropriate station of the illustrative machine, namely the coarse orientation station 42, the fine orientation station 48, and the pre-orientation station 58. Each orienting means is substantially similar in general construction and arrangement except as described below. For convenience, therefore, only one of the orienting means is described hereinafter. The orienting means 192 shown in FIG. 3 is a construction used at the stations 42, 58. This orienting means comprises a mounting bracket 194 mounted on the column fixed to the main frame 10. Four guide rollers 196 (only two visible in FIG. 3) are mounted for rotation on the mounting bracket 194. A support bracket 198 comprises a slide 200 secured thereto, the slide being mounted between the guide rollers 196, the rollers being adjusted to guide the slide substantially vertically. Also mounted on the bracket 198 is a servo motor 202 including a rotary encoder. A disc drive coupling 204 is secured to the output shaft 206 of the servo motor 202. The output shaft 206 of the motor 202 is mounted for rotation about a vertical axis which is coaxial with the axis D of a pick-up head 16 at the orientation station at which the orienting means 192 is mounted. The disc coupling 204 is disposed in register with a disc coupling 208 provided on an upper end portion of the drive sleeve 122 of the tool of the pick-up head 16 disposed at the orientation station. An air cylinder 210 is mounted on the bracket 194 with a piston rod 212 projecting downwardly therefrom, the cylinder 210 and piston rod 212 extending generally vertically. A lower end portion of the piston rod 212 is secured to an arm 214 of the support bracket 198 extending through an opening 216 in the mounting bracket 194. The support bracket 194 is urged upwardly to a raised position in which it is shown by a spring (not shown). When the support bracket 198 is in its raised position the disc couplings 204, 208 are out of engagement. The disc couplings 204, 208 are moved into engagement by admission of air under pressure to the cylinder 210 above a piston thereof to extend the piston rod 212 downwardly out of the cylinder 210. The couplings 204, 208 have a frictional covering on their engaging surface so that when one is rotated, the engaging coupling is also rotated, without slipping. Downward motion of the support bracket 198 under the influence of the cylinder 210 is arranged to be sufficient to urge the drive sleeve 122 and the tubular member 124 downwardly sufficiently to release the clutch pad 130 from locking engagement with the flange 128 and the collar 132. Operation of the cylinder 210 is under the control of the computer control system of the illustrative machine: when the system determines that the clutch means is disengaged, a signal is given to the servo motor 202 causing it to rotate its output shaft 206 and thus the disc coupling 204, through a desired angle as indicated by the rotary encoder of the motor 202. Rotation of the disc coupling 204 which is at this time in engagement with the disc coupling 208 of the sleeve 122 of the tool is thus effective to rotate the drive sleeve 122. When the drive sleeve has been rotated through the desired angle, the computer control system signals the cylinder 210 to release pressure above the piston allowing the support bracket 198 to be raised by the spring (not shown) thereby raising the disc coupling 204 so that the flange 128 and collar 132 are re-engaged with the clutch pad 130 under the influence of the spring 134 thereby locking the tool against further rotation. As the bracket 198 reaches its raised position the disc couplings 204, 208 are moved out of engagement with one another thereby allowing the carousel 14 to index the pick-up head 16 from the orientation station.

The distance, parallel to the axis D, through which the support bracket 198 and disk coupling 204 must be moved in order to engage the disc coupling 208 of the tool and affect rotation of the tool is arranged to be kept to a minimum in the operation of the illustrative machine to keep the cycle times as short as possible. At the orientation stations 42, 58 only a very small movement parallel with the axis D is necessary. However, at the fine orientation station 48 because of the vertical movement of the pick-up heads 16 which takes place in this vicinity as the carousel 14 rotates about its axis B, under the influence of the cam and cam track, the clearance between the disc coupling 204 of the orienting means at the fine orientation station 48 and the disc coupling 208 of a pick-up head at this station must be considerably greater. The orienting means at this station is not shown. However, in order to reduce the inertia of the parts to be moved vertically, the servo motor is mounted on the mounting bracket 194. The disc coupling 204 is mounted on a lower end portion of a drive shaft mounted for vertical sliding movement in bearings which also permit rotation of the shaft about its axis, the shaft being coaxial with the axis D of a pick-up head 16 at the fine orientation station 48. A toothed drive pulley is keyed to the shaft for rotation therewith, the shaft being slideable in the drive pulley. A toothed drive belt passes round the drive pulley and the toothed driving wheel on the output shaft of the servo motor mounted on the mounting bracket 194. Thus the drive shaft may be moved vertically by the air cylinder to move the disc coupling into and out of engagement with the disc coupling 208 of a pick-up head at the fine orientation station 48 whilst the rotary motion is imparted to the drive shaft when necessary by the fixed servo motor. The inertia of the part of the orienting means at the fine orientation station which has to be moved vertically is thus much reduced and the vertical motion into and out of driving engagement with the disc coupling 208 can therefore be effected in about the same period of time as the much shorter motion at the orientation stations 42, 58 using the orienting means shown, albeit with a somewhat more complex rotary drive system.

As mentioned above, the pick-up means of the tools of the pick-up heads 16 is arranged to rotate with the tool itself. In the illustrative machine, the pick-up surfaces 84, 98 rotate with the tool through the angle by which they are driven by the servo motor 202. Thus a component held on the pick-up surfaces 84, 98 is likewise rotated through the same angle. This enables the angular orientation about the axis D of both the first pick-up surface 84 and the second pick-up surface 98 to be controlled by the control system of the illustrative machine. This is especially useful when handling components, for example melf components, which require tools having a pick-up surface of a special configuration adapted to accommodate the component in question. By rotating the tool about the axis D the appropriate first or second pick-up surface 84, 98 can be oriented at the pre-orientation station to register with the orientation of a component presented by the supply means 18 at the pick-up station 26. Thereafter the tool can be rotated about the axis D again, if necessary, to orient a component carried on one of the surfaces 84, 98 substantially in accordance with the orientation required at the placement station 50 of the illustrative machine. If a component when picked up needs to be rotated through a substantial angle from the orientation in which it is picked up, a coarse orientation is effected at the coarse orientation station 42, the tool of the pick-up head 16 being rotated at the station 42 through the desired angle. Irrespective of whether or not any rotation is effected at the station 42, the component may be given a further slight reorientation at the fine orientation station 48.

The illustrative machine comprises a camera (not shown) arranged at the inspection station 46 to inspect a component carried by a pick-up head 16 at the inspection station 46; the operation of the illustrative machine is controlled by the control system according to an image of the component received from the camera. The control system operates to direct a preselected placement position for a component at the placement station 50 by correction of the movement of the X-Y table 12 in accordance with the image of that component received from the camera when that component was at the inspection station 46. Likewise the control system of the illustrative machine is arranged to cause rotation (as described above) of a tool of a head 16 at the fine orientation station 48 about the axis D whereby to adjust the orientation of a component carried by the tool on one of the pick-up surfaces 84, 98 according to an image of that component received from the camera when the component was at the inspection station 46. In this way preselected placement position and orientation of a component programmed into the control system of the illustrative machine can be corrected in accordance with the precise position occupied by a component on a pick-up head 16.

Figure 6:
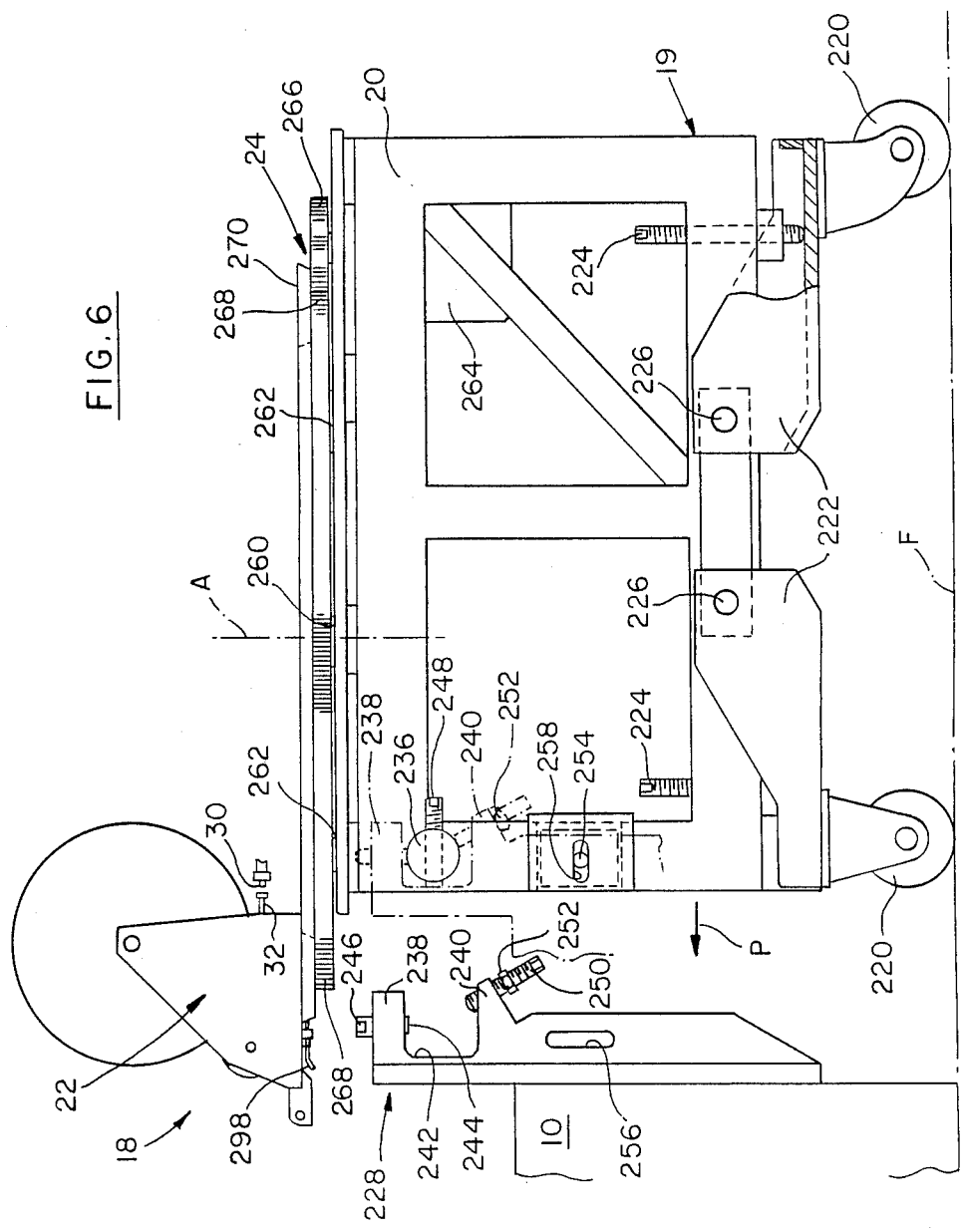
FIG. 6 is a view in side elevation of part of the illustrative component placement machine showing a carriage of component supply means of the illustrative machine.

As hereinbefore mentioned the component supply means 18 of the illustrative machine comprises a carriage 19 including the frame 20. The carriage 19 comprises castors 220 mounted on support brackets 222 pivotally mounted on the sub frame 20. The castors 220 rest on the floor F of a room in which the illustrative machine is installed and the carriage 19 may be wheeled in the direction of the arrow P for locking as a unit to the main frame 10 of the illustrative machine. In FIG. 6 a carriage 19 is shown in full line spaced from the frame 10. The carriage 19 further comprises adjusting screws 224 threaded into the sub frame 20 and bearing on the support brackets 222. By adjustment of the adjusting screws the brackets 222 may be caused to pivot about their pivots 226 to thereby adjust the attitude of the sub frame 20 and to ensure that it is aligned properly with the main frame 10.

The main frame 10 of the illustrative machine comprises locating jaw means of generally U-shaped configuration, with the open end of the U facing the carriage 19. As can be seen from FIG. 1 the illustrative machine comprises two such locating jaw means 228, one at either side of the machine. A leading end portion 230 of the sub frame 20 is arranged to be received between the locating jaw means 228 with side faces 232 of the sub frame 20 slidingly received between locating side surfaces 234 of the locating jaw means 228 whereby to align the sub frame 20 transversely of the illustrative machine; when the sub frame 20 is so-aligned, the pick-up station 26 of the illustrative machine lies substantially on a line connecting the axis A of rotation of the turntable 24 and the axis B of rotation of the carousel 14 of the illustrative machine. As will be appreciated, the sub frame 20 and the main frame 10 are both massive and of substantial dimensions: the spacing of the side surfaces 234 is such that the leading end portion 230 of the sub frame is easily received therebetween and there is a significant, though small, clearance between the side surfaces and at least one of the side faces 232 of the leading end portion 230 of the sub frame 20. As will be explained hereinafter, a transverse displacement of the sub frame of a few millimetres is not significant in the illustrative machine in view of the characterisation feature of the illustrative machine.

As can be seen from FIGS. 1 and 6 the sub frame comprises cylindrical stub projections 236 projecting transversely from the side faces 232 of the leading end portion of the sub frame 20. The adjusting screws 224 are adjusted so that these stub projections 236 are aligned with the locating jaw means 228 to be received between upper and lower members 238,240 of the jaw means. Each locating jaw means 228 has a lengthwise locating face 242 in the trough of the U by which the carriage 19 is located in the direction P relative to the main frame 10 and a heightwise locating face 244 provided by a lower surface of a set screw 246 threaded into the upper member 238 of the locating jaw means 228, by which the sub frame 20 is located heightwise relative to the main frame 10. The locating faces 242 ensure that the distance between the axes A,B is set sufficiently accurately to a desired spacing and the heightwise locating face 244 is arranged such that transfer positions 286 of magazines 22 presented at the transfer station of the illustrative machine are at a desired height relative to pick-up heads 16 at the pick-up station 26.

In order to establish the desired lengthwise and heightwise relationship between the main frame 10 and the sub frame 20, the first time that a carriage 19 is presented to the main frame 10, it is necessary to make appropriate adjustments. As previously mentioned the set screw 246 is adjusted so that the locating face 244 is the correct height: when the carriage 19 is presented to the main frame 10 with the stub projections 236 received in the corresponding locating jaw means 228, the appropriate stud projection is urged into engagement with the locating surface provided by the locating face 244 of the set screw 246. Each stub projection 236 has an adjusting screw 248 threaded into it, the adjusting screw lying substantially horizontally. A face of the adjusting screw 248 abuts the lengthwise locating face 242 of the locating jaw means 228. The adjusting screws 248 are adjusted so that when the screws abut the locating faces 242 the relationship between the axes A,B is as desired. Once the set screws 246 have been properly adjusted, there will normally be no need to make any further adjustment of these screws even when different carriages 19 are substituted. Likewise, once the adjusting screws 248 of a carriage 19 have been correctly adjusted there will normally be no further need to make any further adjustment of these, provided that the carriage 19 is presented to the same main frame 10 which will usually be the case. In practice a single main frame 10 and the placement means carried thereby may utilise two or more carriages each of which will be dedicated to that main frame 10. However, in some circumstances it may be desired to present a carriage to a different main frame 10 in which eventuality adjustment of the adjusting screws 248 may be necessary.

The illustrative machine further comprises locking means by which the carriage 19 may be locked in a desired position to the main frame 10: the desired position will, of course, be determined by engagement of the stub projection 236 with the heightwise locating face 244 of the set screw 246 and by engagement of the adjusting screws 248 with the locating faces 242 as just described. The locking means of the illustrative machine comprises threaded bolts 250 which are screw threaded at an angle (see FIG. 6) into the lower member 240 of the locating door means 228. When the carriage 19 is presented to the main frame 10 the adjusting screws 224 are adjusted so that the stub projections 236 enter the locating jaw means between the upper and lower members 238,240 just clearing the locating face 244 of the set screw 246. When the carriage 19 is in place with the stub projections 236 received in the locating jaw means 228 with the adjusting screws 248 engaging the locating faces 242, the threaded bolts 250 are screwed into engagement with the stub projection urging the projection 236 upwardly firmly into engagement with the heightwise locating face 244 of the set screw 246 and urging the adjusting screws 248 firmly against the lengthwise locating faces 242. When the threaded bolts 250 are tightened as much as possible, the bolts are locked in position by lock nuts 252, as shown in chain - line in FIG. 6 thereby firmly locking the carriage 19 to the main frame in the desired position determined as described above. A pair of jacks (not shown) at the trailing end of the carriage 19 are lowered to engage the floor and take the load at the trailing end of the carriage. When in this position, although both leading and trailing sets of castors 220 are in engagement with the ground, the castors 220 do not bear any load, the weight of the leading end of the carriage 19 being borne by the locating jaw means 228 through the stub projections 236 and the trailing end by the jacks (not shown).

The main frame 10 and carriage 19 are further secured together after the carriage 19 has been locked in the desired position as described above, by bolts 254 which pass through vertical slots 256 in the main frame 10 and horizontal slots 258 in the sub frame 20: the slots 256,258 allow for the horizontal and vertical adjustment of the sub frame 20 relative to the main frame 10 which may occur when the carriage is locked in the desired position.

Figure 7:
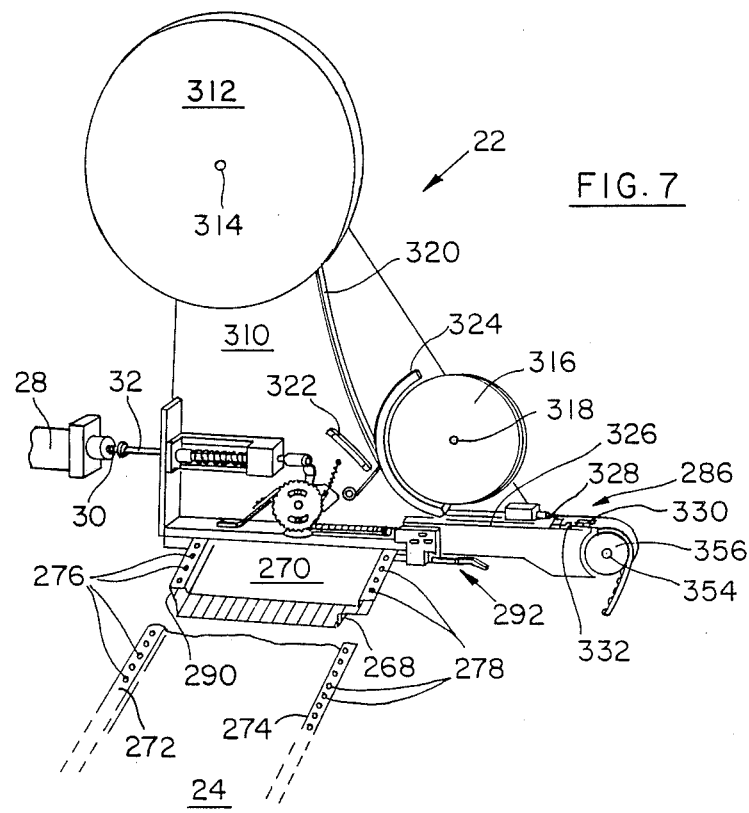
FIG. 7 is a perspective view showing part of a turntable of component supply means of the illustrative machine on which is mounted a magazine.
Figure 8:
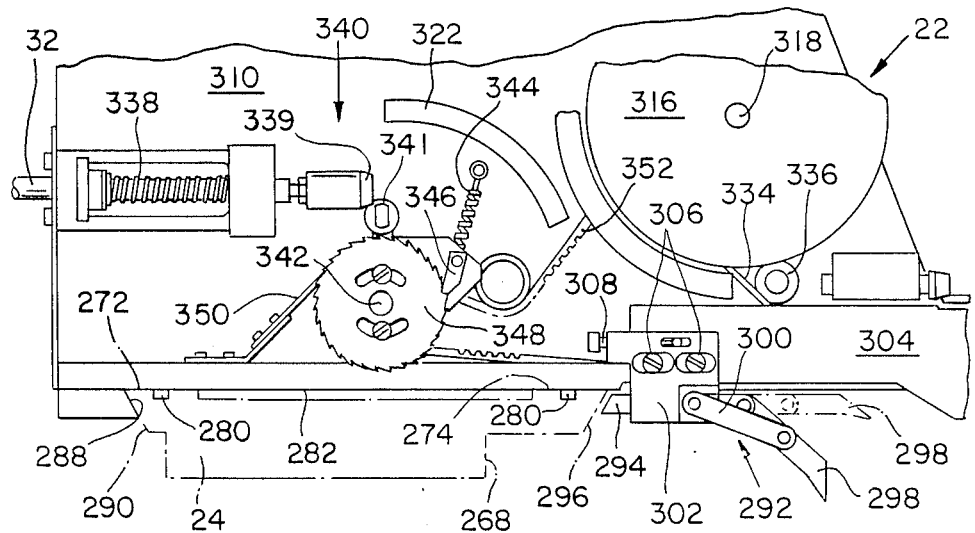
FIG. 8 is a fragmentary view of a magazine of the illustrative machine.

As hereinbefore mentioned the turntable 24 is mounted for rotation on the sub frame 20 for rotation about the axis A. A central axle 260 projects downwardly from the turntable and is received in bearings in the sub frame. Roller bearings 262 are also mounted on the sub frame to support peripheral portions of the turntable 24 as it rotates about the axis A. A servo motor 264 including a rotary encoder is also mounted on the sub frame 20 with an output shaft thereof projecting upwardly carrying a toothed gear wheel 266 in driving engagement with toothed gearing 268 of the turntable. The turntable 24 further comprises an annular support ring 270 mounted above the toothed gearing 268. The annular support ring 270 presents a supporting surface provided by inner and outer, coplanar, upwardly facing portions 272,274 on which the magazines 22 are supported (see especially FIGS. 7-9). A series of holes 276,278 are formed in the inner and outer portions 272,274 of the supporting surface, the holes being paired so that the inner and outer holes 276,278 of each pair lie on a line radial to the axis A of the turntable 24. The holes 276,278 are elongated, radially. The inner holes 276 are equally spaced one from the next, as are the outer holes 278. Locating pegs 280 project downwardly from a downwardly facing lower surface 282 of the magazine 22. When the magazine 22 is mounted on the component supply means 18 the lower surface 282 rests on the inner and outer portions 272,274 of the supporting surface of the turntable with the two locating pegs 280 received one in the inner hole 276 and one in the outer hole 278 of a pair of the holes. The pegs are a sliding fit in the holes and leave room for radial movement of the magazine (in view of the elongated nature of the holes 276,278) but little room for any arcuate play. Each magazine 22 is thus mounted to lie substantially radially of the axis A.

The magazines 22 project beyond the turntable 24 and, as can be seen especially from FIGS. 1 and 9, the locus 284 of movement of the transfer positions 286 of the magazine occupies an annular region which extends over the main frame 10.

Each magazine 22 of the illustrative machine comprises clamp means by which the magazine 22 may be located transversely to the direction of movement of the turntable, that is in the radial direction. This clamp means comprises cooperating locating faces 288,290 on the magazine 22 and carrier 24 respectively and clamping instrumentalities comprising toggle mechanisms 292 on each magazine 22 so constructed and arranged that by engagement of the toggle mechanism 292 with the turntable 24 the magazine 22 may be clamped to the turntable 24 with the locating faces 288,290 in engagement whereby to locate the magazine in a direction radially of the turntable. As hereinbefore mentioned by engagement of the locating pegs 280 in the holes 276,278 each magazine 22 is located on the turntable, extending radially, in a mounting position spaced substantially equally one from the next (considered in the direction of movement of the turntable 24 i.e. arcuately about the axis A).

The locating face of the turntable 24 is provided by a frusto-conical surface 290 flaring outwardly above the toothed gearing 268 and meeting the outer portion 274 of the supporting surface to form a locating portion which is substantially V-shaped in cross section; this locating portion is received in a complementary V-shaped groove on the magazine 22, the groove on the magazine 22 being defined by the lower surface 282 and the locating face 288.

The toggle mechanism 292 of the magazine 22 comprises a clamping bar 294 having an inclined nose portion 295 which, when the toggle mechanism 92 is locked, is urged against an inclined face of the turntable 24 provided by a frusto-conical surface 296 inclined inwardly above the gear ring until it intersects the outer portion 274 of the supporting surface of the turntable. The frusto-conical surfaces 290,296 and supporting surface 272,274 have the appearance, in section along a radius of the turntable, of a dovetail. As the inclined nose portion 295 of the clamping bar 294 is urged against the surface 296 the locating faces 288,290 are impelled firmly into engagement and by virtue of the inclination of the surfaces 288,290 and the surface 296 and inclined nose portion 295 of the clamping bar 294, the lower surface 282 of the magazine is clamped firmly against the supporting surface 272,274 of the turntable 24. The toggle mechanism 292 comprises an operating lever 298 (shown in FIG. 8 in full line in an unlocked position and in chain dot line in the locked position of the toggle mechanism) and a link 300 pivotally connected to the operating lever and to a mounting block 302 of the mechanism 292. The mounting block 302 is secured to a frame portion 304 of the magazine 22 by clamping screws 306. An adjusting screw 308 is threaded into the mounting block 302 and bears on part of the frame portion 304: by adjustment of the adjusting screw 308 when the clamping screws 306 are loosened, the mounting block 302 may be moved relative to the frame portion 304 to apply sufficient tension to the toggle mechanism so that, when the operating lever 298 is pushed over its central position to make the toggle, sufficient force is applied to the surface 296 by the clamping bar 294 to firmly lock the magazine 27 in position on the turntable 24.

The remainder of the magazine 22 operates in a manner which is generally known but will be described herein in some detail. The magazine 22 comprises the frame portion 304, a part of which provides the lower surface 282, and, upstanding from the frame portion 304, a support plate 310. A supply reel 312 is mounted for rotation about an axle 314 carried by the support plate 310. A take up reel 316 is mounted for rotation about an axle 318 also carried by the support plate 310. Component carrying tape 320 is guided from the reel 312 by arcuate guides 322, 324 into a slideway provided by a groove in an upper surface of the frame portion 304 in which the tape 320 is retained by overhanging flanges 326. A cover plate 328 covers the slideway at a down stream end portion of the magazine. An opening 330 in the cover plate 328 defines the transfer position of the magazine. A further opening 332 in the cover plate 328 is provided through which a cover tape 334 is peeled from the component tape 320 to expose components to be transferred at the transfer position 286. The cover tape 334 passes over an upper rear surface of the cover plate 328 and is guided around a roller 336 to the take up reel 316 about which it is wound.

Figure 4:
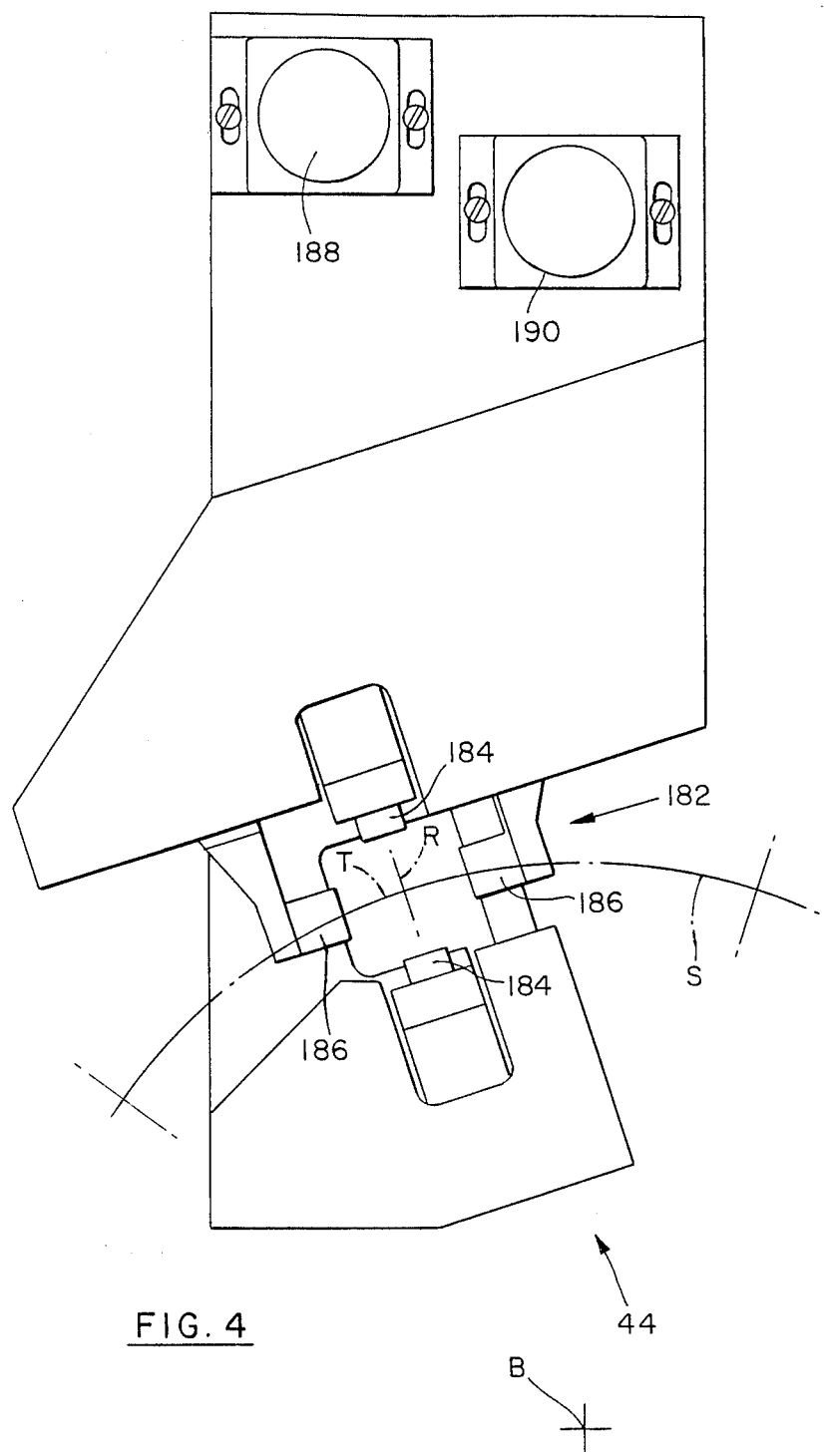
FIG. 4 is a diagrammatic plan view of a location system of the illustrative machine.
Figure 5:
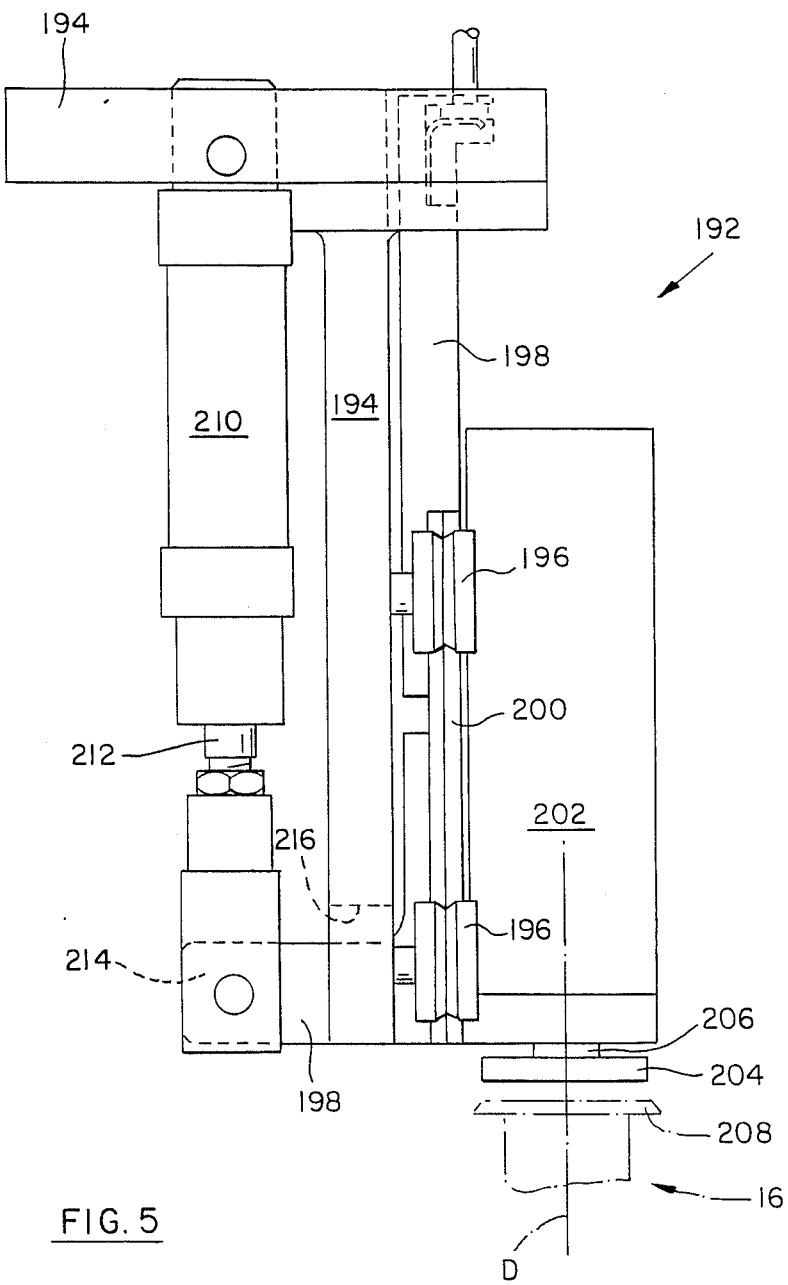
FIG. 5 is a side view showing orienting means of the machine.

The indexing plunger 32 is also mounted on the support plate 310, urged into a retracted position, in which it is shown in the drawings, by a spring 338. The plunger 32 is arranged to engage a ratchet lever 340 mounted for pivotal movement about an axle 342. A leading end portion 339 of the plunger 32 is of frustoconical form and engages a roll portion 341 of the lever 340 when the plunger 32 is extended from the cylinder 338. The shape of the leading end 339 is selected so that it engages the roll portion 341 with a camming action, thereby reducing the shock which would otherwise arise upon contact of the plunger 32 with the lever 340. This leads to a reduction in vibration and noise desirable in tape feeder magazines in general, not only in the illustrative machine. The lever 340 is urged in a counter clockwise direction by a spring 344. A pawl 346 is pivoted on the ratchet lever and engages between teeth of a ratchet wheel 348. Thus movement of the indexing plunger 32 to the right viewing FIG. 4 is effective to pivot the ratchet lever 340 in a clockwise direction, the pawl 346 engaging the teeth of the ratchet wheel 348 to rotate the ratchet wheel 348 in a clockwise direction. A leaf spring 350 engages the teeth of the ratchet wheel and prevents rotation of the ratchet wheel in a counter clockwise direction viewing FIG. 4. Rotation of the ratchet wheel 348 drives a toothed belt 352 through a gear wheel (not shown) secured to the ratchet wheel for rotation about the axle 342. The toothed belt 352 passes round a toothed wheel (not shown) secured to the axle 318 to which the take up wheel 316 is also secured. Thus rotation of the ratchet wheel 348 in a clockwise direction is effective to rotate the take up wheel 316 in a clockwise direction thereby applying tension to the cover tape 334. The belt 352 also passes round a toothed wheel (not shown) secured to an axle 354 to which a sprocket wheel 356 is also secured. Sprockets of the sprocket wheel 356 engage sprocket holes in the tape 320. Thus operation of the indexing plunger is effective to feed the component tape 320 towards the transfer position 286 and to strip off the cover tape 334, winding it up on the take up wheel 316. The gearing of the various drive wheels is such that by one feed stroke of the indexing plunger, the component tape 320 is indexed forward through a feed step equal to the distance between the centres of adjacent component pockets. Thus operation of the indexing plunger supplies a fresh component to the transfer position of the magazine 22.

In FIG. 9 a magazine 22 of the illustrative machine is shown at the pick-up station 26: as can be seen from FIG. 9 the magazine projects above the main frame 10 of the illustrative component placement machine. Mounted on the main frame 10 at the pick-up station is sensing means 358 of the component supply means 18, the sensing means being mounted to sense a location mark 362 (see FIG. 10) on a magazine 22 (conveniently on the cover plate 328) at the pick-up station 26 when the supply means 18 is in a characterising mode. The sensing means 358 comprises a sensor 360 for emitting radiation towards the location mark 362 and detecting reflected radiation. The sensor comprises a light emitting diode 364 and a photo transistor (or diode) 366 by which reflected light is detected. As can be seen from FIG. 10 the location mark 362 is provided by a junction 368 between a region 370 which reflects the radiation emitted by the light emitting diode 364 and a region 372 which does not reflect that radiation. When the component supply means 18 is in the characterising mode computer control means of the illustrative machine is arranged to index the turntable 24 through a series of equiangular rotary steps corresponding with the spacing between the transfer positions 286 of adjacent magazines 22, starting from an initial position in which the transfer position 286 of a first of the magazines 22 is at the pick-up station 26 thereby establishing a reference position of the turntable. This reference position is recorded by the computer system and the sensing means senses the location mark 362 of the first magazine 22 and by comparison with the reference position determines the rotary position about its axis A of rotation of the turntable 22 in which the transfer position 286 of the first magazine 22 is at a desired precise location of the pick-up station 26; this rotary position is recorded by the control system. The rotary position of the turntable 24 in which the transfer position 286 of the first magazine 22 is at said precise location is determined by the control means signalling drive means of the turntable to rotate in a clockwise or counter clockwise direction (viewing FIG. 1) depending on whether the photo transistor 366 is detecting any reflected light or not. Rotation of the turntable continues until the photo transistor 366 detects a change in the level of reflected light indicating that the junction 368 between the regions 370, 372 is in register with the sensing means 358 and it is this position of the turntable 24 which is recorded by the control system. Having recorded the rotary position of the turntable 24 in which the transfer position 286 of the first magazine 22 is in said precise location, the control system signals the drive means to index the turntable 24 through one of said rotary steps to present the transfer position 286 of a second magazine 22 at the pick-up station 26. By sensing of its location mark 362 in the same manner as described above with reference to the first magazine 22, the rotary position about the axis A of rotation of the turntable 24 in which the transfer position 286 of the second magazine 22 is in said precise location is determined and recorded by the control system. The control system then signals the drive means to repeat the indexing movement step by step, to inspect the location mark for every magazine 22 mounted on the turntable, until the rotary position of the turntable 24 about its axis A has been determined and recorded for every magazine 22. When the supply means 18 of the illustrative component placement machine is in its operational mode, the control means rotates the turntable 24 to the recorded rotary position of the turntable necessary to present the transfer position 286 of a selected magazine 22 at said precise location of the pick-up station 26.

The illustrative component placement machine also comprises, at the pick-up station 26 means for severing the component tape 320 immediately downstream of the transfer position to separate tape from which components have been unloaded from the remainder of the tape and means for collecting the severed tape constructed substantially as described by way of example in copending European patent application No. 86303987.1 (publication No. 0203801). Two such severing means are provided; a first severing means 374 is disposed at the pick-up station 26 opposite a magazine 22 at the pick-up station 26. The first severing means 374 is intended to deal with wide component tape which is relatively inflexible. When handling such wide component tape the cover plate 328 of a wide tape magazine 22 does not follow the curvature of the sprocket wheel 356 as does the cover plate 328 of a magazine intended for dealing with narrow tape (as shown in FIG. 9). The tape 320 from which components have been removed at the transfer position 286 by the pick-up head 16 project above the sensing means 358 beyond the sprocket wheel 356 into the first severing means 374 where the end of the tape 320 is cropped using a cutting arm 376 substantially as described by way of example in the aforementioned copending European patent application. The illustrative machine also comprises a second severing means 378 mounted on an upper member 380 of the main frame 10 beneath the frame portion 304 of the magazine which projects beyond the turntable 24 above the main frame 10. Narrow, more flexible component tape (in which small components are supplied) which would be too flexible to traverse the gap between the sprocket wheel 356 and the first severing means 374 while yet maintaining adequate alignment with the cutting arm 376 is guided by the curved cover plate 328 (see FIG. 9) downwardly to a cutting arm (not shown) of the second severing means 378 disposed generally below the position of the sprocket wheel 356. Severed pieces of tape are removed from the severing means 374,378 by suction through appropriate passage ways to a collecting bin (not shown) in a position readily accessible to the operator.

The cover plate 328 is pivotally mounted about the axle 354 and, when feeding tape from a new supply reel 312, the cover plate 328 may be pivoted in a clockwise sense (viewing FIG. 9) giving access to the sprocket wheel 356 so that the sprockets of the wheel 356 can be readily engaged in the sprocket holes of the tape. When this has been done the cover plate 328 is pivoted in a counter clockwise sense back to the position in which it is 382.

In the operation of the illustrative machine when first setting up the machine the computer control system of the illustrative machine is set in the characterisation mode. A carriage 19 of the component supply means 18 of the illustrative machine is positioned in a desired position relative to the main frame 10 of the illustrative machine and locked in that position by the threaded bolts 250 of the locating jaw means 228. A first magazine 22 is positioned at the pick-up station 26 by the operator and the illustrative machine is put into operation. The computer control system first records the position of the turntable 24 as a reference position and then inspects the first magazine 22 until it locates the junction 368 of the location mark 362 and compares this adjusted position with the recorded reference position and records the adjusted position, thereby determining and recording the rotary position about the axis A of rotation of the turntable in which the transfer position 286 of the first magazine 22 is at a precise location of the pick-up station. When the first magazine has been dealt with in this way, the computer control system signals the drive means (i.e. motor 264) to index the turntable 24 through a rotary step corresponding with the spacing between transfer positions 286 of adjacent magazines 22 until the transfer position 286 of the second magazine 22 is at the pick-up station 26. The junction 368 of the location mark 362 of the second magazine is then established, by comparison with the reference position, and this position recorded to thereby determine and record the rotary position about the axis A of rotation of the turntable 24 in which the transfer position of the second magazine 22 is at said precise location of the pick-up station 26. Thereafter the turntable 24 is indexed through said rotary steps, successively, to present the transfer positions 286 of all the positions on the turntable 24 at which magazines 22 may be mounted and, by sensing of the location mark, to determine and record the rotary position about the axis A of rotation of the turntable 24 for every magazine 22 mounted on the turntable 24.

In some circumstances some of the positions of the turntable 24 which might be occupied by a magazine 22 are not so occupied: if there are any unoccupied mounting positions for magazines 22 the control system is arranged to scan through a preselected angular range to either side of the position occupied by the turntable at the end of the indexing step which rotated the turntable to that position and, if no location mark 362 is found, to signal to the operator that no magazine is present at this position. Alternatively, the control system may be arranged so that the operator can indicate which positions of the turntable are not occupied by magazines so that the control system can cause the turntable 24 to be indexed through two (or more) of the rotary steps, at appropriate points, thereby saving some time in characterising the feeders.

During operation of the illustrative machine, if it should be necessary to replace one or more magazines 22 for any reason (for example if a magazine should become exhausted or if it is desired to supply some different components) the operator switches the control system to the characterisation mode and indicates to the control system the positions on the turntable 24 in which the magazines have been replaced. The control system, in this circumstance, signals the turntable 24 to rotate to present the transfer position 286 of the first of the new magazines 22 at the pick-up station 26 and to establish the transfer position 286 in said precise location of the pick-up station 26 in the manner previously discussed. The control system then signals the turntable 24 to rotate to present the next of the new magazines 22 to be located with its transfer position 286 at the pick-up station 26 and then to accurately determine the transfer position as discussed above.

When all of the magazines 22 of the component supply means 18 of the illustrative component placement machine have been characterised as discussed previously, the control system is switched to the operational mode and the machine cycle started. A substrate (for example a printed circuit board, not shown) on which components are to be mounted is fed to the X-Y table 12 and located thereon in an accurately known position. If desired two substrates may be positioned on the X-Y table in adjacent positions, components being placed on the substrate adjacent the placement station 50 and adhesive material being placed on the other substrate by a suitable adhesive dispensing system (not shown) as described in the aforementioned PCT patent application. Rotation of the carousel 14 about its axis B and of the turntable 24 about its axis A is coordinated by the control system to present an appropriate one of the magazines 22 at the pick-up station 26 for transfer of a component to one of the pick-up heads 16 at the pick-up station, the sequence in which the magazines are presented at the pick-up station being determined by the control system in accordance with the sequence in which components are to be placed on the substrate. The control system also causes selection of an appropriate one of the pick-up heads 16 (by operation of the bowden cable mechanism 68) and an appropriate one of the pick-up surfaces 84, 98 dependent upon the components to be picked-up at the pick-up station 26 and placed at the placement station 50. Likewise, the tools are oriented at the various orientation stations 42, 48, 58 according to the orientation which it is necessary for the tool to adopt for the particular component to be placed. Should a particular pick-up head 16 fail to pick-up a component or a component, having been picked-up, be discovered to be faulty when inspected at the inspection station 46, the control system will cause a subsequent pick-up head to pick-up the appropriate component and reschedule the machine operation as necessary. When a substandard or incorrect component is detected at the inspection station 46, this will be carried through the placement station 50 without operation of the placement mechanism and dumped into a reject container at the dump station 54. As the illustrative machine operates with the supply means 18 in its operational mode the computer control system of the illustrative machine causes the turntable 24 to rotate to the recorded rotary position of the turntable necessary to present the transfer position 286 of a selected one of the magazines 22 at said precise location of the pick-up station 26. The rotary encoder of the servo motor 264 is used to signal the rotary position of the turntable and the angle through which the turntable has been rotated by the servo motor 264 to the control system in a known manner.

The construction and operation of the supply means 18 of the illustrative machine is such that the transfer positions 286 of selected magazines 22 can be moved rapidly and precisely to the selected precise location in the transfer station in alignment with the axis D of the pick-up head at the pick-up station 26. Because the position occupied by each magazine 22 on the turntable 24 is characterised it is not necessary that the carriage be located especially accurately in a direction transverse to the line connecting the axes A,B nor for either the turntable itself or the individual magazines to be especially accurately machined (although, of course, they will necessarily have to be reasonably accurate): it is the accuracy with which the sensing means 358 is able to identify the junction 368 of the location mark 362 and the precision with which the location mark is placed on each magazine 22 which establishes the accuracy of the apparatus. As will be appreciated, the curvature of the locus 284 of the transfer positions 286 is small and in the region of the transfer station 26 approximates a straight line. Thus, a slight displacement of the carriage 19 to the left or right (within the constraints placed by the locating jaw means 228) will not cause any significant difference to the position of the transfer positions 286 considered in the direction established by the line drawn between the axes A,B. As each magazine is characterised by the sensing means 358 the precise positions of the location holes 276,278 are not of significance provided that the holes are positioned reasonably accurately so that the magazines 22 lie generally radially and the locating faces 288,290 are sufficiently accurately positioned to ensure that the transfer positions 286 of each magazine 22 lie sufficiently accurately on the locus 284.

By providing that the illustrative machine can operate in the characterisation mode to establish the position of each magazine, the cycle time of the machine is much more rapid than permitted by a system which has to positively locate each magazine as it arrives at the pick-up station 26 when operating to place components. The whole machine is therefore able to operate at high speed with good accuracy without resorting to ultra high precision engineering to achieve the necessary accuracy. This accuracy is achieved while yet permitting ready and rapid exchange of individual magazines or indeed exchange of the whole carriage 19 of the component supply means without resorting to complex and delicate setting up operations.

The illustrative machine is able to handle picking and placing of electrical or electronic components at high rates. The vacuum pick-up apparatus of the illustrative machine permits use of a plurality of tools having pick-up surfaces of different areas and/or configurations without the delay entailed in exchanging tools at a tool supply magazine as proposed in some heretofore known machines. A single head of the vacuum pick-up apparatus of the illustrative machine provides two tools, one of which has a pick-up surface of larger area than the other, an appropriate one of which can be positively selected under station 56 before engagement of the tool with a component to be picked up. Furthermore, provision of two such pick-up heads 16 on each carrier 34 permits selection of any one of four tools of an appropriate size and configuration The construction and arrangement of the placement means of the illustrative machine is such that the cycle time is rapid and delays due to inertia of moving parts are militated against. In addition, because of the design of the tools, it is possible to place components at the placement station 50 in restricted spaces between adjacent components.

In the operation of the illustrative machine, using the orienting means described herein, it is possible to conveniently and rapidly orient the pick-up means of a tool of a pick-up head to a desired orientation both before a component is picked up so that a specially configured pick-up surface of the tool is correctly oriented in register with the component prior to pick-up, and after picking up a component to orient the component correctly relative to a placement position on a substrate on which the component is to be placed.

The illustrative machine is able to handle picking and placing of electrical or electronic components at high rates and to orient the component accurately to a relatively fine angular position, to within an accuracy of ±3° in the case of smaller components and an accuracy of ±1° in the case of larger components.

Because the tools are locked against rotation by the clutch means, during movement of the carousel and the general operation of the illustrative machine except when tools are being oriented at the orientation stations 42, 48, 58 there is no significant possibility of the tools becoming misoriented during operation of the illustrative machine for example by vibration or by accidental contact, as could easily occur in the construction described in UK Patent No. 2096498B. Furthermore, the orienting means and the construction of the pick-up heads is relatively simple and does not require the cutting of expensive gears nor the control necessary to ensure engagement of gearing when it is necessary to orient a tool, as is the case of the machine described in UK patent No. 2096498B.

I claim:

1. A machine for placing surface mount components on a substrate comprising
    pick-up head means for picking up a component located at a pick-up location,
    means for sequentially locating components at the pick-up location including
    a turntable mounted for rotation about a vertical axis,
    means for rotating said turntable,
    means for stopping the rotation of said turntable at any selected angular position,
    a plurality of component supply magazines secured to said turntable, each magazine having a location mark having a light reflecting region and a light absorbing region, said regions abutting along a straight vertical line,
    illuminating means for directing light towards the location mark of a magazine located to position a component at the component pick-up location,
    sensing means for receiving light reflected from a location mark of a magazine located to position a component at the component pick-up location,
    means for determining the angular location of said turntable when said sensing means senses the vertical line joining the light reflection and light absorbing regions of the location mark of each of the component supply magazines and for defining the angular position of the turntable when each of said component supply magazines is at the pick-up location,
    means for disabling said determining means when the angular position for each magazine has been determined, and
    means for locating said turntable at said angular positions to locate each of said component supply magazines at said pick-up location during machine operation with said determining means disabled.

2. A machine for placing surface mount components on a substrate according to claim 1, wherein said rotating means comprises means for displacing said turntable in predetermined angular steps.

3. A machine for placing surface mount components on a substrated according to claim 2, wherein said sensing means includes a phototransistor.

* * * * *